United States Patent
Younis

(10) Patent No.: US 12,506,477 B2
(45) Date of Patent: Dec. 23, 2025

(54) ASYMMETRIC OUTPUT DRIVER

(71) Applicant: Samsung Electronics Co., Ltd., Gyeonggi-do (KR)

(72) Inventor: Mohamed Badr Younis, Champaign, IL (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/435,329

(22) Filed: Feb. 7, 2024

(65) Prior Publication Data

US 2025/0141445 A1 May 1, 2025

Related U.S. Application Data

(60) Provisional application No. 63/594,533, filed on Oct. 31, 2023.

(51) Int. Cl.
*H03K 17/687* (2006.01)

(52) U.S. Cl.
CPC ................ *H03K 17/6872* (2013.01)

(58) Field of Classification Search
CPC .. H03K 17/04; H03K 17/04206; H03K 17/08; H03K 17/082; H03K 17/0822; H03K 17/687; H03K 17/6872; H03K 17/6874; H03K 19/003; H03K 19/00315; H03K 19/01; H03K 19/01707; H03K 19/01721
See application file for complete search history.

(56) References Cited

U.S. PATENT DOCUMENTS

| | | | |
|---|---|---|---|
| 5,389,834 A * | 2/1995 | Kinugasa | H03K 19/01721 326/110 |
| 6,791,897 B2 * | 9/2004 | Choi | G11C 8/08 365/189.11 |
| 9,071,244 B2 | 6/2015 | Poulton et al. | |
| 9,905,287 B2 | 2/2018 | Wang et al. | |
| 10,171,268 B2 | 1/2019 | Yu et al. | |
| 10,367,591 B2 | 7/2019 | Raj | |
| 2022/0060187 A1 | 2/2022 | Zhang et al. | |

FOREIGN PATENT DOCUMENTS

WO WO 2022/104509 5/2022

* cited by examiner

*Primary Examiner* — Long Nguyen

(74) *Attorney, Agent, or Firm* — The Farrell Law Firm, P.C.

(57) ABSTRACT

A system and method for operating an output driver are disclosed, the method comprising connecting a first P-channel field-effect transistor (PFET) between a supply voltage and an output node; connecting a second PFET in parallel with the first PFET between the supply voltage and the output node; connecting a first N-channel field-effect transistor (NFET) between the supply voltage and a gate of the second PFET; and adjusting a voltage at a gate of the first NFET based on a voltage at the output node to modulate a voltage of a gate of the second PFET to maintain a pull-up resistance within a predefined range.

22 Claims, 9 Drawing Sheets

ASYMMETRIC OUTPUT DRIVER

CROSS-REFERENCE TO RELATED APPLICATION

This application claims the priority benefit under 35 U.S.C. § 119 (e) of U.S. Provisional Application No. 63/594,533, filed on Oct. 31, 2023, the disclosure of which is incorporated by reference in its entirety as if fully set forth herein.

TECHNICAL FIELD

The disclosure generally relates to electronic devices. More particularly, the subject matter disclosed herein relates to high-speed memory interfaces and serial communication systems.

SUMMARY

In the field of high-speed memory interfaces and serial communication systems, the design of a transmitter can greatly affect the performance and efficiency of such systems. High speed serial links typically involve a driver (transmitter), a transmission channel (such as a cable or printed circuit board (PCB) trace), and a receiver. One of the key challenges in these systems is avoiding signal reflection, which can degrade the quality of the transmitted signal. Standard practice involves using 50-ohm termination at both the driver and receiver ends to mitigate this issue. Without proper termination, signal ringing may occur, complicating data extraction at the receiver and affecting overall system performance.

Transmitter designs may incorporate pull-up (PU) and pull-down (PD) networks to control signal transmission. These networks are often separately calibrated using high-precision external resistors to maintain desired impedance characteristics. However, some approaches to designing these PU and PD networks face limitations, struggling to linearize resistance across varying output voltages and to maintain impedance within specified tolerances, especially under conditions of high data rates and voltage swings. Additionally, they may rely on complex structures to achieve the desired impedance control, which often results in slower operational speeds and increased system complexity.

Many approaches to designing output drivers for high-speed interfaces focus on balancing the impedance of PU and PD networks. However, maintaining a consistent impedance profile across a range of operating conditions remains a challenge. Given the limitations of existing technologies, there is a need for an improved transmitter design for high-speed memory interfaces. The design should effectively manage the impedance of both PU and PD networks across different voltage levels, ensuring minimal signal distortion and high data rate compatibility while maintaining a compact and efficient architecture.

The present disclosure addresses this need by introducing an innovative approach to designing the PU and PD networks in transmitters. It particularly focuses on achieving linear impedance characteristics and maintaining them within a specified tolerance range, even under varying voltage conditions. Furthermore, as described below, asymmetric architecture may be used for the PU and PD networks to achieve this.

In an embodiment, an output driver comprising a PU circuit includes a first P-channel field-effect transistor (PFET) connected between a supply voltage and an output node; a second PFET connected in parallel with the first PFET between the supply voltage and the output node; and a first N-channel field-effect transistor (NFET) connected between the supply voltage and a gate of the second PFET, wherein a voltage at a gate of the first NFET is adjusted based on a voltage at the output node to modulate a voltage of a gate of the second PFET to maintain a pull-up resistance within a predefined range.

In an embodiment, a method for operating an output driver includes connecting a first PFET between a supply voltage and an output node; connecting a second PFET in parallel with the first PFET between the supply voltage and the output node; connecting a first NFET between the supply voltage and a gate of the second PFET; and adjusting a voltage at a gate of the first NFET based on a voltage at the output node to modulate a voltage of a gate of the second PFET to maintain a pull-up resistance within a predefined range.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1:
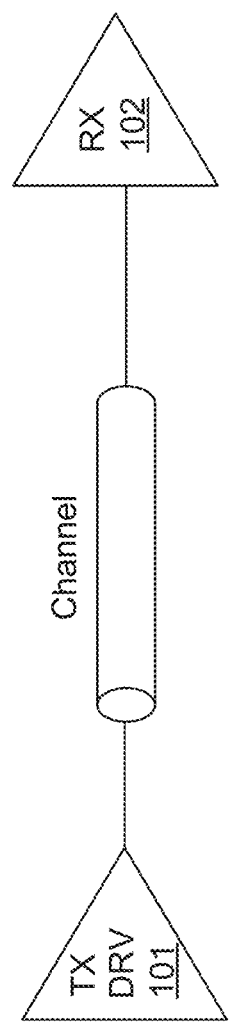
FIG. 1 illustrates a high speed serial link, according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary"

means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

The output resistance of drivers is subject to variation under different process, voltage, and temperature (PVT) conditions due to the inherent variability in semiconductor manufacturing, operating conditions, and thermal effects. In the manufacturing process, slight deviations in the physical and chemical properties of semiconductor materials can lead to changes in the electrical characteristics of transistors, thus altering the output resistance of the drivers. Voltage fluctuations further contribute to this variation as they can affect the voltage drop across the driver and the transistors' performance within the driver circuit. Additionally, temperature changes impact carrier mobility within the semiconductor material, which directly influences the resistance of the transistors in the drivers.

These variations in output resistance can cause changes in the output swing, which may be defined as the difference between the high and low voltage levels that the driver can produce. As the output resistance changes, so does the voltage drop across the driver when driving a signal, leading to a corresponding change in the output swing. A higher than expected output resistance would decrease the output swing, whereas a lower resistance would increase it.

In addition, variations in output resistance can lead to return loss violations. Drivers should be designed to match the characteristic impedance of the transmission line it drives to minimize signal reflections. When PVT conditions cause the driver's output resistance to stray from this optimal impedance, the mismatch can result in a greater portion of the signal being reflected back toward the source, measured as return loss. If the return loss exceeds acceptable thresholds, it signifies a violation that can cause signal integrity issues, such as signal degradation or increased error rates, thus impairing the performance of system.

FIG. 1 illustrates a high speed serial link, according to an embodiment.

Referring to FIG. 1, a high speed serial link structure is illustrated with a transmission driver (TX DRV) 101. To avoid reflections on the transmission channel, the driver's output impedance should be matched to the channel characteristic impedance. Matching the driver to the channel means that the output impedance should be equal to the characteristic impedance of the channel (or within a tolerance range) across the output voltage. Accordingly, a signal of various voltages may be transmitted from the TX DRV 101 through the channel, to a receiver (RX) 102, which may modulate the signal (e.g., via amplification or slicing), or perform further processing.

Figure 2:
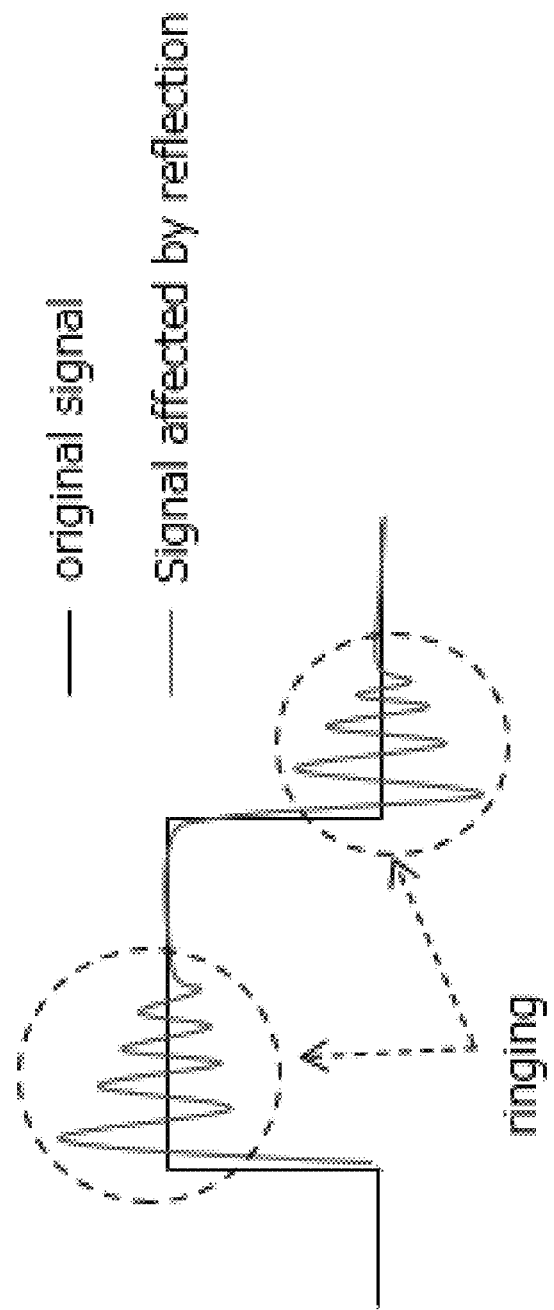
FIG. 2 illustrates a square wave signal contrasted with an actual driver signal, according to an embodiment.

FIG. 2 illustrates a square wave signal contrasted with an actual driver signal, according to an embodiment.

Referring to FIG. 2, the original signal (the square wave signal) corresponds to an ideal signal provided by the driver. However, when the driver is not matched to the channel (shown as the signal affected by reflection in FIG. 2), the signal reflects in the transmission channel, which leads to the formation of ringing. The ringing effect is characterized by oscillations following the main signal transitions, representing both attenuated and delayed versions of the original square wave. On the other hand, when the driver is matched to the channel, no (or a greatly reduced amount of) reflections occur and the signal integrity is maintained.

Figure 3:
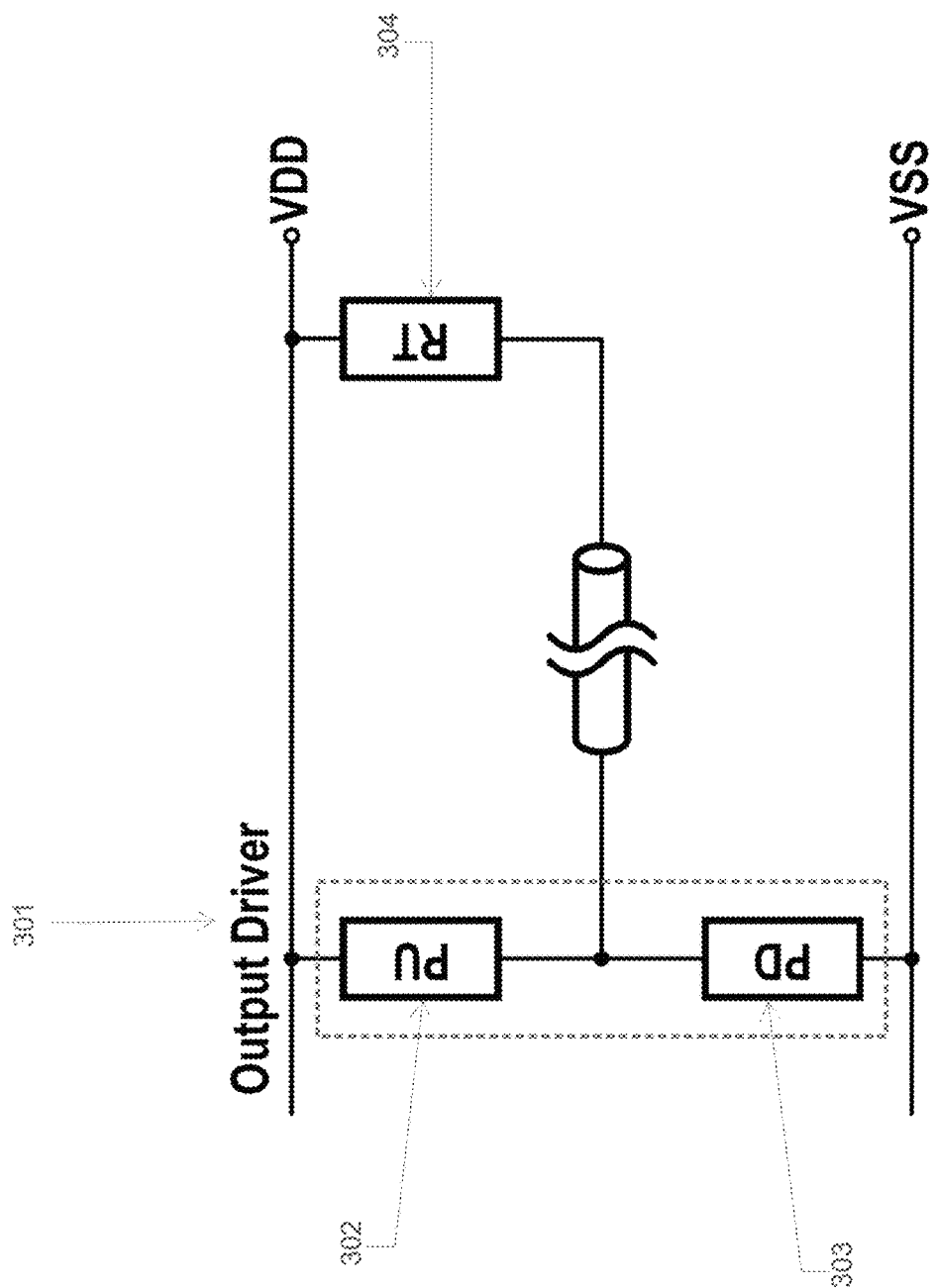
FIG. 3 illustrates a pseudo-open drain interface circuit, according to an embodiment.

FIG. 3 illustrates a pseudo-open drain interface circuit, according to an embodiment.

Pseudo-open drain, refers to an interface technology in integrated circuits that mimics the behavior of a traditional open drain configuration while incorporating both PU and PD elements internally. This design allows for precise control over output characteristics, such as resistance and voltage levels, and is beneficial in applications requiring efficient power management and compact circuitry. In particular, the design is more power-efficient in applications that transmit more one-bits than zero-bits.

Referring to FIG. 3, an output driver 301 contains a PU network 302 and a PD network 303. The PU network 302 is connected to the supply voltage labeled VDD and is responsible for driving the output voltage high when activated. Adjacent to the PU network 302 is the PD network 303, which, when engaged, pulls the output voltage down to a lower voltage level that is referred to as the ground, known as VSS.

Additionally, there is a termination impedance, denoted as RT 304, connected to the supply voltage VDD. This component serves as the termination impedance to the supply and sets the output voltage level through a voltage divider mechanism.

The voltage divider, implied by the relative positioning of the PD network 303 and the termination impedance RT 304, determines the lower voltage level at the output when the PD network 303 is active. The output voltage in this circuit is thus able to swing from the supply voltage VDD to this lower voltage, which is defined by the voltage divider's ratio between the PD network 303 and the termination impedance RT 304.

The present Application introduces an architecture for the transmitter's PU network that improves the linearity of the output impedance, ensuring that it remains constant despite changes in output voltage. This is achieved by a combination of a switching element and a biasing network. The switching element (a switch) operates based on the data being transmitted (zero or one), and the biasing network acts in feedback in an opposite manner, providing a stable PU impedance that does not fluctuate with the output voltage. Also, the transmitter's PU network may be accompanied by an asymmetrical PD network to compensate for a skewed range of output voltages.

Figure 4:
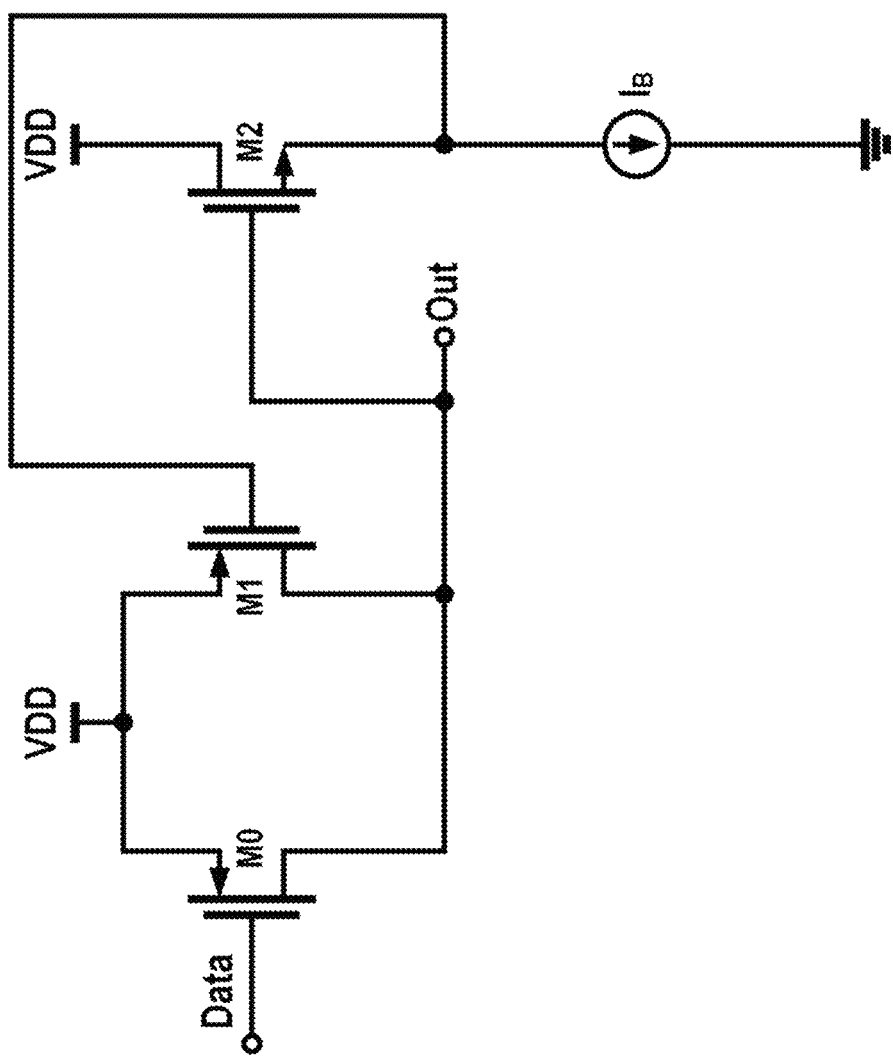
FIG. 4 illustrates a PU circuit architecture of an asymmetric output driver, according to an embodiment.

FIG. 4 illustrates a PU circuit architecture of an asymmetric output driver, according to an embodiment.

Referring to FIG. 4, PFETs, M0 and M1, are connected in parallel between the supply voltage (VDD) and the output node (Out). Transistor M0 functions as a switch, and is controlled directly by the data signal. Depending on the data being transmitted, M0 turns on or off, thereby allowing or preventing current flow from VDD to the output node.

Transistor M1, which operates as the biased PFET, is included to counteract the inherent non-linearity of the resistance of M0 with respect to the output voltage. The biased PFET M1 is controlled by a feedback loop that senses the output voltage and adjusts the gate bias of M1 to maintain a consistent PU resistance. The feedback loop utilizes a source follower stage that includes transistor M2, which is connected to the gate of M1. This configuration enables the gate voltage of M1 to be modulated in response to changes in the output voltage, ensuring that the resistance of M1 increases as the output voltage increases.

The interaction between M0 and M1 causes, as the output voltage increases, the resistance of M0 to decrease and the resistance of M1 to increase. When these transistors M0 and M1 operate in parallel, their combined resistance may remain substantially constant (or within a predefined range) across the output voltage range. For example, the predefined range may be defined based on the standard practice of using 50-ohm termination but adjusted to account for specific design considerations of the transmitter. For instance, a predefined range might be 45 ohms to 55 ohms, allowing for slight variations while ensuring compatibility with standard termination practices.

This parallel configuration of decreasing and increasing resistances results in a PU resistance that exhibits minimal variations in response to changes in the output voltage. The constant current source (IB) biases the circuit and contributes to the stability and predictability of the resistance values.

Therefore, the output impedance of the driver may remain within the desired specifications, regardless of fluctuations in the output voltage.

Figure 5:
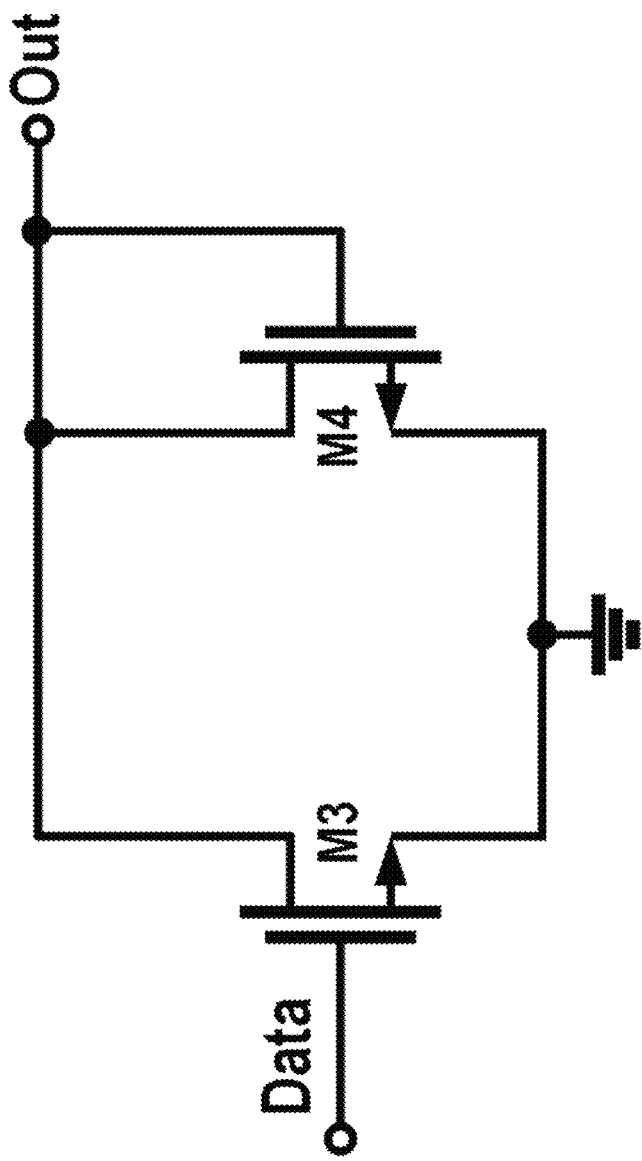
FIG. 5 illustrates a PD circuit architecture of an asymmetric output driver, according to an embodiment.

FIG. 5 illustrates a PD circuit architecture of an asymmetric output driver, according to an embodiment.

Referring to FIG. 5, the driver circuit includes two NFETs, M3 and M4, arranged in parallel between a common node and the output node (Out). The output node (Out) may correspond to the same output node (Out) shown in FIG. 4, above. NFET M3 operates as a switch, controlled by the input data signal. When the data signal is active (on), M3 allows current to flow towards the ground, effectively pulling down the output voltage.

NFET M4 is configured in a diode-connected setup, which means its gate and drain are shorted, creating a path for current that inherently has a resistance characteristic that decreases as the output voltage increases. This diode connection introduces a resistance profile that is inverse to that of M3, whose resistance increases with an increase in output voltage.

Therefore, M3, when turned on by the data signal, has a resistance that increases with the output voltage. In contrast, M4, with its diode-connected structure, provides a resistance that decreases as the output voltage increases. When these two transistors M3 and M4 operate in parallel, the combined effect is a PD resistance that remains relatively constant (or within a predefined range) across the output voltage range.

Figure 6:
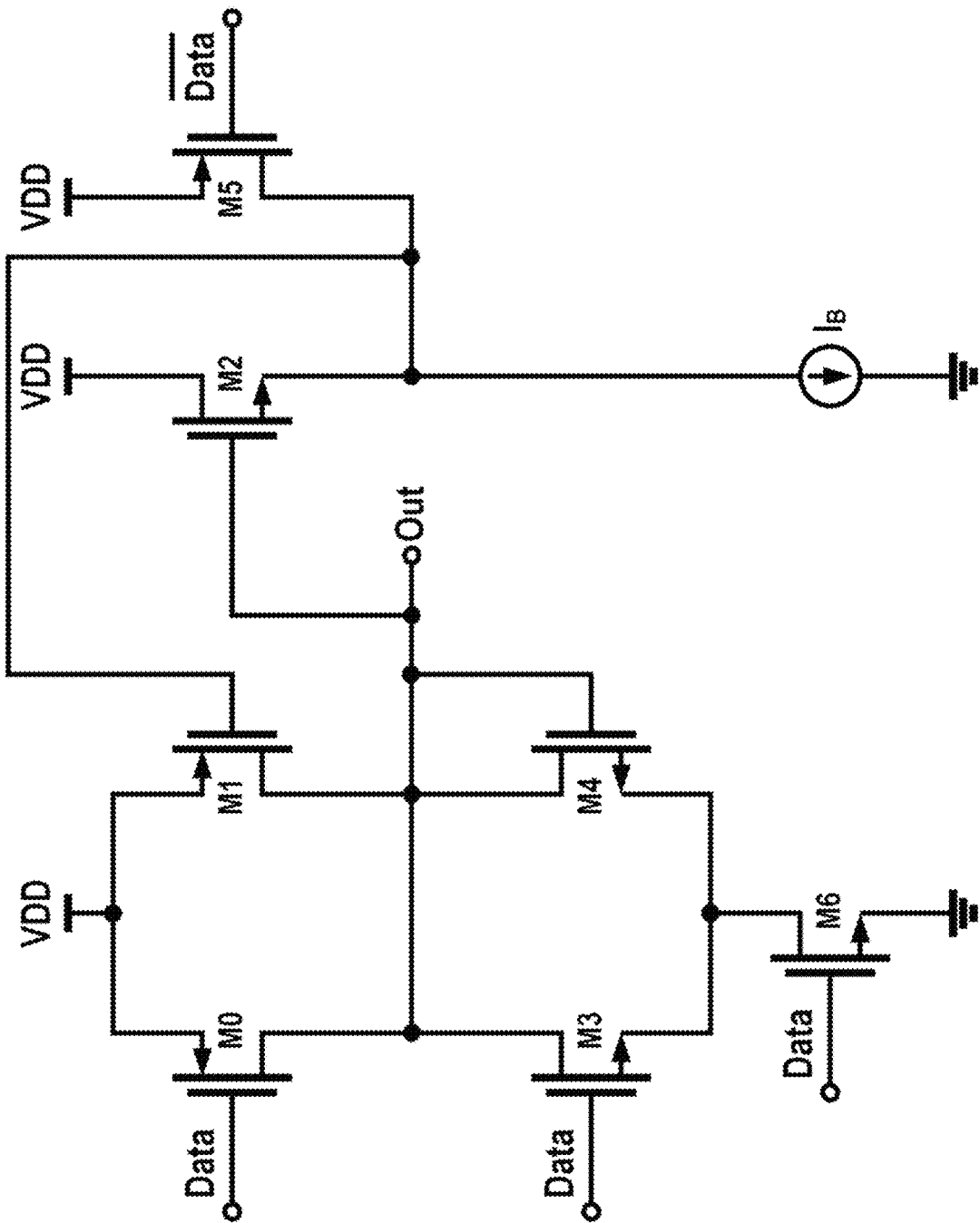
FIG. 6 illustrates an output driver including asymmetric PU and PD circuit architecture, according to an embodiment.

FIG. 6 illustrates an output driver including asymmetric PU and PD circuit architecture, according to an embodiment.

Referring to FIG. 6, the driver combines the previously discussed PU (FIG. 4) and PD (FIG. 5) networks into a singular, cohesive circuit that effectively maintains output impedance and minimizes DC current paths during operation.

More specifically, the circuit of FIG. 6 integrates a PU circuit architecture composed of PFETs M0 and M1, and NFET M2, and a PD circuit architecture composed of NFETs M3 and M4. These circuits are constructed to ensure that the output (Out) can be driven high or low with minimal resistance variation to maintain signal integrity in high-speed data transmission. The PU network is responsible for driving the output high by providing a path to the supply voltage (VDD), while the PD network pulls the output low towards ground.

To address the issue of DC current that may flow through the driver when both the PU and PD networks are simultaneously active, two additional transistors, M5 and M6, are included. Transistor M5 serves as a switch to completely disconnect the PU network when the PD network is active. This ensures that no DC current flows through the PU network, which would otherwise be wasteful and could potentially cause heating and reliability concerns. Conversely, transistor M6 fulfills a similar role for the PD network, isolating it completely when the PU network is operational.

The exclusive use of active PU or PD networks in this driver design allows for a more compact layout, resulting in significant area savings on the integrated circuit. Such an area-efficient design is particularly advantageous in high-density circuits where space is at a premium.

The addition of M5 and M6 transistors also enhances the driver's switching performance, as these transistors ensure that each network is only active when necessary, thus improving the transient response of the circuit and reducing cross-conduction losses.

Accordingly, a feedback loop incorporated within the PFET biasing network actively controls the impedance. This feedback mechanism adjusts the gate voltage in real-time, based on the sensed output voltage, to maintain a consistent impedance across a predefined voltage swing, such as approximately 500 millivolts. This feature allows the transmitter to operate at high speeds without the impedance drift that typically occurs with changes in gate, source, and drain voltages in a transistor.

Additionally, the asymmetrical design approach for both the PU and PD networks, represents a relatively simple design approach that achieves a straight-line impedance within the predefined operating output voltage range.

The circuit design avoids the use of passive components, such as resistors, within the design. The elimination of resistors not only simplifies the architecture but also significantly reduces the area required on the chip, which is a substantial advantage in high-speed driver design due to space constraints.

Figure 7:
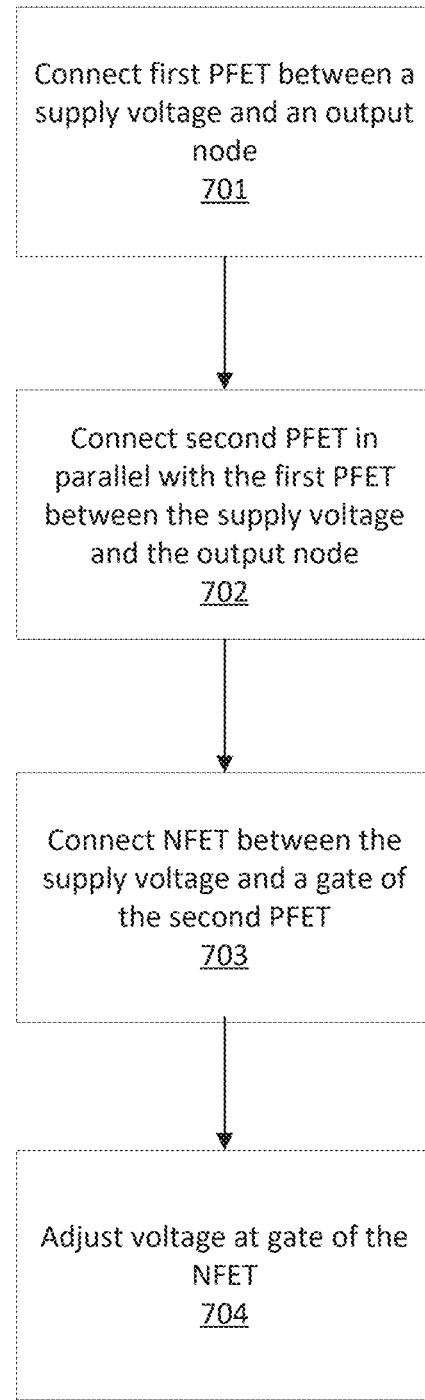
FIG. 7 illustrates a flowchart showing a method for operating an output driver, according to an embodiment.

FIG. 7 illustrates a flowchart showing a method for operating an output driver, according to an embodiment.

The method illustrated in FIG. 7 may be performed by a controller and/or processor configured to execute instructions to control an output driver, including PFETs and/or NFETs, to perform the steps of the method.

Referring to FIG. 7, in step 701, a first PFET is connected between a supply voltage and an output node. The terminology of "connecting" the first PFET may mean that that the first PFET is positioned in the driver so that current flows may flow through it. Also, the first PFET may operate as a switch that allows or prevents current flow from the supply voltage to the output node.

In step 702, a second PFET is connected in parallel with the first PFET between the supply voltage and the output node. Also, the second PFET may be a biased PFET to counteract non-linearity of a resistance of the first PFET with respect to the voltage at the output node.

In step 703, an NFET is connected between the supply voltage and a gate of the second PFET. In this manner, an on/off state of the second PFET may be based on an on/off state of the NFET.

In step 704, a voltage is adjusted at a gate of the NFET. The voltage at the gate of the NFET may be adjusted based on a voltage at the output node to modulate a voltage of the gate of the second PFET to maintain a pull-up resistance within a predefined range.

Figure 8:
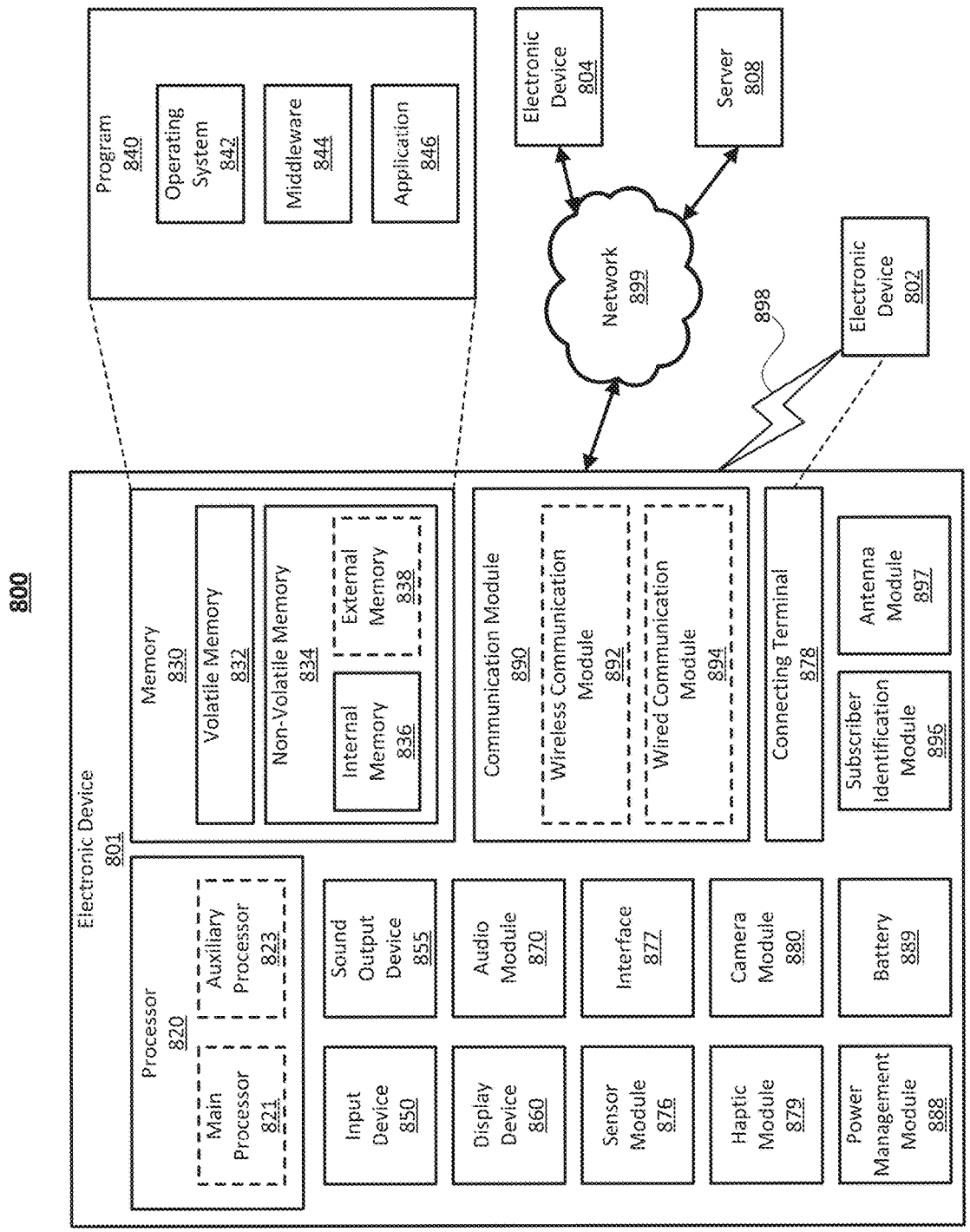
FIG. 8 illustrates a block diagram of an electronic device in a network environment, according to an embodiment.

FIG. 8 is a block diagram of an electronic device in a network environment, according to an embodiment.

Referring to FIG. 8, an electronic device 801 in a network environment 800 may communicate with an electronic device 802 via a first network 898 (e.g., a short-range wireless communication network), or an electronic device 804 or a server 808 via a second network 899 (e.g., a long-range wireless communication network). The electronic device 801 may communicate with the electronic device 804 via the server 808. The electronic device 801 may include a processor 820, a memory 830, an input device 850, a sound output device 855, a display device 860, an audio module 870, a sensor module 876, an interface 877, a haptic module 879, a camera module 880, a power management module 888, a battery 889, a communication module 890, a subscriber identification module (SIM) card 896, or an antenna module 897. In one embodiment, at least one (e.g., the display device 860 or the camera module 880) of the components may be omitted from the electronic device 801, or one or more other components may be added to the electronic device 801. Some of the components may be implemented as a single integrated circuit (IC). For example, the sensor module 876 (e.g., a fingerprint sensor, an iris sensor, or an illuminance sensor) may be embedded in the display device 860 (e.g., a display).

The processor 820 may execute software (e.g., a program 840) to control at least one other component (e.g., a hardware or a software component) of the electronic device 801 coupled with the processor 820 and may perform various data processing or computations.

As at least part of the data processing or computations, the processor 820 may load a command or data received from another component (e.g., the sensor module 876 or the communication module 890) in volatile memory 832, process the command or the data stored in the volatile memory 832, and store resulting data in non-volatile memory 834. The processor 820 may include a main processor 821 (e.g., a central processing unit (CPU) or an application processor (AP)), and an auxiliary processor 823 (e.g., a graphics processing unit (GPU), an image signal processor (ISP), a sensor hub processor, or a communication processor (CP)) that is operable independently from, or in conjunction with, the main processor 821. Additionally or alternatively, the auxiliary processor 823 may be adapted to consume less power than the main processor 821, or execute a particular function. The auxiliary processor 823 may be implemented as being separate from, or a part of, the main processor 821.

The auxiliary processor 823 may control at least some of the functions or states related to at least one component (e.g., the display device 860, the sensor module 876, or the communication module 890) among the components of the electronic device 801, instead of the main processor 821 while the main processor 821 is in an inactive (e.g., sleep) state, or together with the main processor 821 while the main processor 821 is in an active state (e.g., executing an application). The auxiliary processor 823 (e.g., an image signal processor or a communication processor) may be implemented as part of another component (e.g., the camera module 880 or the communication module 890) functionally related to the auxiliary processor 823.

The memory 830 may store various data used by at least one component (e.g., the processor 820 or the sensor module 876) of the electronic device 801. The various data may include, for example, software (e.g., the program 840) and input data or output data for a command related thereto. The memory 830 may include the volatile memory 832 or the non-volatile memory 834. Non-volatile memory 834 may include internal memory 836 and/or external memory 838.

The program 840 may be stored in the memory 830 as software, and may include, for example, an operating system (OS) 842, middleware 844, or an application 846.

The input device 850 may receive a command or data to be used by another component (e.g., the processor 820) of the electronic device 801, from the outside (e.g., a user) of the electronic device 801. The input device 850 may include, for example, a microphone, a mouse, or a keyboard.

The sound output device 855 may output sound signals to the outside of the electronic device 801. The sound output device 855 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 860 may visually provide information to the outside (e.g., a user) of the electronic device 801. The display device 860 may include, for example, a display, a hologram device, or a projector and control circuitry to control a corresponding one of the display, hologram device, and projector. The display device 860 may include touch circuitry adapted to detect a touch, or sensor circuitry (e.g., a pressure sensor) adapted to measure the intensity of force incurred by the touch.

The audio module 870 may convert a sound into an electrical signal and vice versa. The audio module 870 may obtain the sound via the input device 850 or output the sound via the sound output device 855 or a headphone of an external electronic device 802 directly (e.g., wired) or wirelessly coupled with the electronic device 801.

The sensor module 876 may detect an operational state (e.g., power or temperature) of the electronic device 801 or an environmental state (e.g., a state of a user) external to the electronic device 801, and then generate an electrical signal or data value corresponding to the detected state. The sensor module 876 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 877 may support one or more specified protocols to be used for the electronic device 801 to be coupled with the external electronic device 802 directly (e.g., wired) or wirelessly. The interface 877 may include, for example, a high-definition multimedia interface (HDMI), a universal serial bus (USB) interface, a secure digital (SD) card interface, or an audio interface.

A connecting terminal 878 may include a connector via which the electronic device 801 may be physically connected with the external electronic device 802. The connecting terminal 878 may include, for example, an HDMI connector, a USB connector, an SD card connector, or an audio connector (e.g., a headphone connector).

The haptic module 879 may convert an electrical signal into a mechanical stimulus (e.g., a vibration or a movement) or an electrical stimulus which may be recognized by a user via tactile sensation or kinesthetic sensation. The haptic module 879 may include, for example, a motor, a piezoelectric element, or an electrical stimulator.

The camera module 880 may capture a still image or moving images. The camera module 880 may include one or more lenses, image sensors, image signal processors, or flashes. The power management module 888 may manage power supplied to the electronic device 801. The power management module 888 may be implemented as at least part of, for example, a power management integrated circuit (PMIC).

The battery 889 may supply power to at least one component of the electronic device 801. The battery 889 may include, for example, a primary cell which is not rechargeable, a secondary cell which is rechargeable, or a fuel cell.

The communication module 890 may support establishing a direct (e.g., wired) communication channel or a wireless communication channel between the electronic device 801 and the external electronic device (e.g., the electronic device 802, the electronic device 804, or the server 808) and performing communication via the established communication channel. The communication module 890 may include one or more communication processors that are operable independently from the processor 820 (e.g., the AP) and supports a direct (e.g., wired) communication or a wireless communication. The communication module 890 may include a wireless communication module 892 (e.g., a cellular communication module, a short-range wireless communication module, or a global navigation satellite system (GNSS) communication module) or a wired communication module 894 (e.g., a local area network (LAN) communication module or a power line communication (PLC) module). A corresponding one of these communication modules may communicate with the external electronic device via the first network 898 (e.g., a short-range communication network, such as BLUETOOTH™, wireless-fidelity (Wi-Fi) direct, or a standard of the Infrared Data Association (IrDA)) or the second network 899 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 892 may identify and authenticate the electronic device 801 in a communication network, such as the first network 898 or the second network 899, using subscriber information (e.g., international mobile subscriber identity (IMSI)) stored in the subscriber identification module 896.

The antenna module 897 may transmit or receive a signal or power to or from the outside (e.g., the external electronic device) of the electronic device 801. The antenna module 897 may include one or more antennas, and, therefrom, at least one antenna appropriate for a communication scheme used in the communication network, such as the first network 898 or the second network 899, may be selected, for example, by the communication module 890 (e.g., the wireless communication module 892). The signal or the power may then be transmitted or received between the communication module 890 and the external electronic device via the selected at least one antenna.

Commands or data may be transmitted or received between the electronic device 801 and the external electronic device 804 via the server 808 coupled with the second network 899. Each of the electronic devices 802 and 804 may be a device of a same type as, or a different type, from the electronic device 801. All or some of operations to be executed at the electronic device 801 may be executed at one or more of the external electronic devices 802, 804, or 808. For example, if the electronic device 801 should perform a function or a service automatically, or in response to a request from a user or another device, the electronic device 801, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 801. The electronic device 801 may provide the outcome, with or without further processing of the outcome, as at least part of a reply to the request. To that end, a cloud computing, distributed computing, or client-server computing technology may be used, for example.

Figure 9:
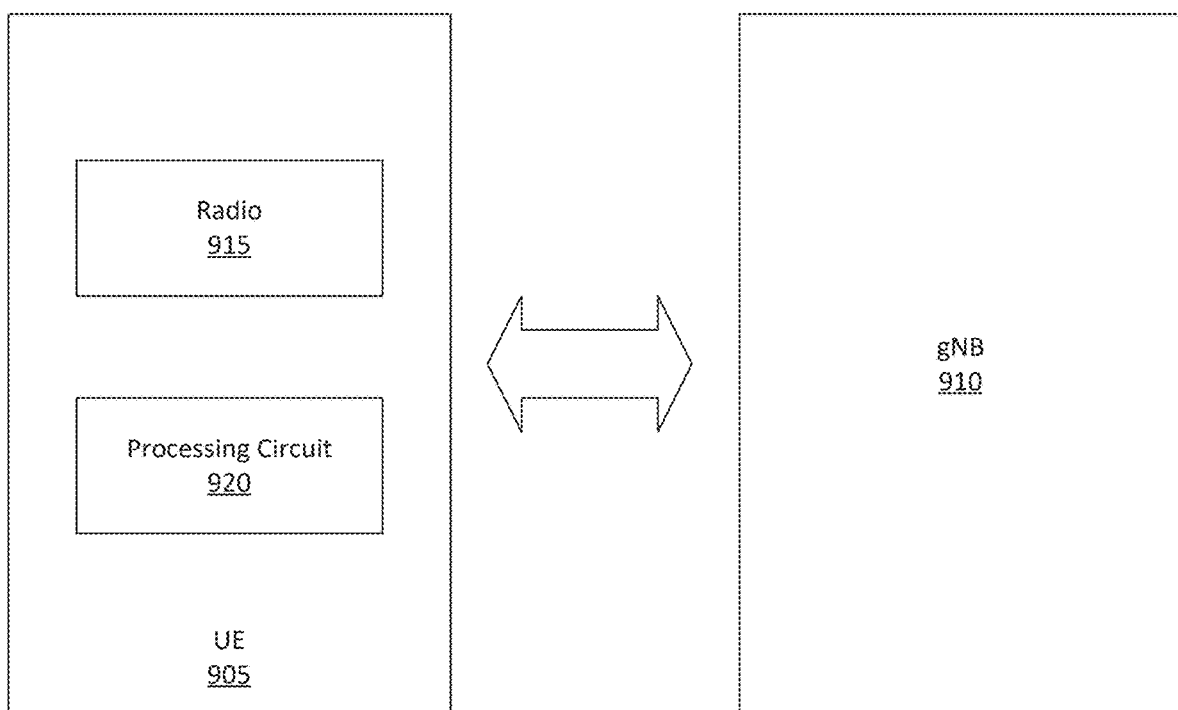
FIG. 9 illustrates a system including a UE and a network node (gNB), in communication with each other, according to an embodiment.

FIG. 9 illustrates a system including a UE and a gNB, in communication with each other, according to an embodiment.

Referring to FIG. 9, a UE 905 and a gNB 910, in communication with each other, are provided. The UE may include a radio 915 and a processing circuit (or a means for processing) 920, which may perform various methods disclosed herein, e.g., the method illustrated in FIG. 9. For example, the processing circuit 920 may receive, via the radio 915, transmissions from the gNB 910, and the processing circuit 920 may transmit, via the radio 915, signals to the gNB 910.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Additionally or alternatively, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. An output driver comprising a pull-up (PU) circuit including:
    a first P-channel field-effect transistor (PFET) connected between a supply voltage and an output node;
    a second PFET connected in parallel with the first PFET between the supply voltage and the output node; and
    a first N-channel field-effect transistor (NFET) connected between the supply voltage and a gate of the second PFET,
    wherein a voltage at a gate of the first NFET is adjusted based on a voltage at the output node to modulate a voltage of a gate of the second PFET to maintain a pull-up resistance within a predefined range.

2. The output driver of claim 1, wherein the first PFET is controlled directly by an input data signal and operates as a switch to allow or prevent current flow from the supply voltage to the output node.

3. The output driver of claim 1, wherein the second PFET operates as a biased PFET to counteract non-linearity of a resistance of the first PFET with respect to the voltage at the output node.

4. The output driver of claim 3, wherein the resistance of the first PFET decreases and a resistance of the second PFET increases as the voltage at the output node increases.

5. The output driver of claim 1, wherein a combined resistance of the first and second PFETs remains within a predefined range across a range of output voltages.

6. The output driver of claim 1, further comprising a pull-down (PD) circuit including:
   a second NFET connected between a common node and the output node; and
   a third NFET connected in parallel with the second NFET between the common node and the output node.

7. The output driver of claim 6, wherein the second NFET is controlled directly by an input data signal and operates as a switch to allow or prevent current flow towards ground.

8. The output driver of claim 6, wherein a resistance of the third NFET decreases as the voltage at the output node increases.

9. The output driver of claim 8, wherein a resistance of the second NFET increases as the voltage at the output node increases.

10. The output driver of claim 6, further comprising a third PFET configured to disconnect the PU circuit when the PD circuit is active.

11. The output driver of claim 6, further comprising a fourth NFET configured to disconnect the PD circuit when the PU circuit is active.

12. A method for operating an output driver comprising a pull-up (PU) circuit, the method comprising:
   operating a first P-channel field-effect transistor (PFET) of the PU circuit, the first PFET being connected between a supply voltage and an output node;
   operating a second PFET of the PU circuit, the second PFET being connected in parallel with the first PFET between the supply voltage and the output node;
   operating a first N-channel field-effect transistor (NFET) of the PU circuit, the first NFET being connected between the supply voltage and a gate of the second PFET; and
   adjusting a voltage at a gate of the first NFET based on a voltage at the output node to modulate a voltage of a gate of the second PFET to maintain a PU resistance within a predefined range.

13. The method of claim 12, further comprising:
   controlling the first PFET directly using an input data signal to operate the first PFET as a switch that allows or prevents current flow from the supply voltage to the output node.

14. The method of claim 12, further comprising:
   operating the second PFET as a biased PFET to counteract non-linearity of a resistance of the first PFET with respect to the voltage at the output node.

15. The method of claim 14, wherein the resistance of the first PFET decreases and a resistance of the second PFET increases as the voltage at the output node increases.

16. The method of claim 12, wherein a combined resistance of the first and second PFETs remains within a predefined range across a range of output voltages.

17. The method of claim 12, further comprising:
   operating a second N-channel field-effect transistor (NFET) of a pull-down (PD) circuit, the second NFET being connected between a common node and the output node; and
   operating a third NFET of the PD circuit, the third NFET being connected in parallel with the second NFET between the common node and the output node.

18. The method of claim 17, further comprising:
   controlling the second NFET directly by an input data signal to operate as a switch that allows or prevents current flow towards ground.

19. The method of claim 17, wherein a resistance of the third NFET decreases as the voltage at the output node increases.

20. The method of claim 19, wherein a resistance of the second NFET increases as the voltage at the output node increases.

21. The method of claim 17, further comprising:
   operating the PU circuit to be disconnected using a third PFET of the PU circuit when the PD circuit is active.

22. The method of claim 17, further comprising:
   operating the PD circuit to be disconnected using a fourth NFET of the PD circuit when the PU circuit is active.

* * * * *